United States Patent [19]

Karlin et al.

[11] 4,138,641

[45] Feb. 6, 1979

[54] INSTRUMENT AMPLIFIER AND LOAD DRIVER HAVING OFFSET ELIMINATION AND COMMON MODE REJECTION

[75] Inventors: Richard A. Karlin; Kirk K. O. K. Rim, both of Chicago, Ill.

[73] Assignee: Sun Electric Corporation, Crystal Lake, Ill.

[21] Appl. No.: 788,421

[22] Filed: Apr. 18, 1977

[51] Int. Cl.$^2$ .......................... G01R 1/30; H03F 3/45; H03F 1/26

[52] U.S. Cl. ........................... 324/123 R; 324/117 H; 330/69; 330/149; 330/258

[58] Field of Search ................. 330/69, 258, 200, 149; 324/123 R, 123 C, 99 D, 117 H, 235, 251, 158 MG; 73/88.5 R

[56] References Cited

U.S. PATENT DOCUMENTS 3,728,626  4/1973  Douglas et al. .................. 324/99 D Primary Examiner—Rudolph V. Rolinec
Assistant Examiner—Ernest F. Karlsen Attorney, Agent, or Firm—Allegretti, Newitt, Witcoff & McAndrews

[57] ABSTRACT

The disclosure describes improved apparatus for driving a load, such as a meter, in proportion to a source voltage produced by a signal generator. The apparatus includes a non-differential gain stage for generating an amplified voltage between a gain stage output and one of the generator outputs. The non-differential gain stage is followed by a differential stage which generates a rereferenced voltage between the differential stage output and one of the load terminals. The rereferenced voltage is proportional to the amplified voltage and is substantially independent of any offset voltage between the one generator output and the one load terminal. By coupling the rereferenced voltage to the load, the load voltage is made proportional to the source voltage irrespective of changes in the offset voltage between the one generator output and the one load terminal. The load may include a meter and an amplifying stage for ranging and zeroing the meter.

23 Claims, 2 Drawing Figures

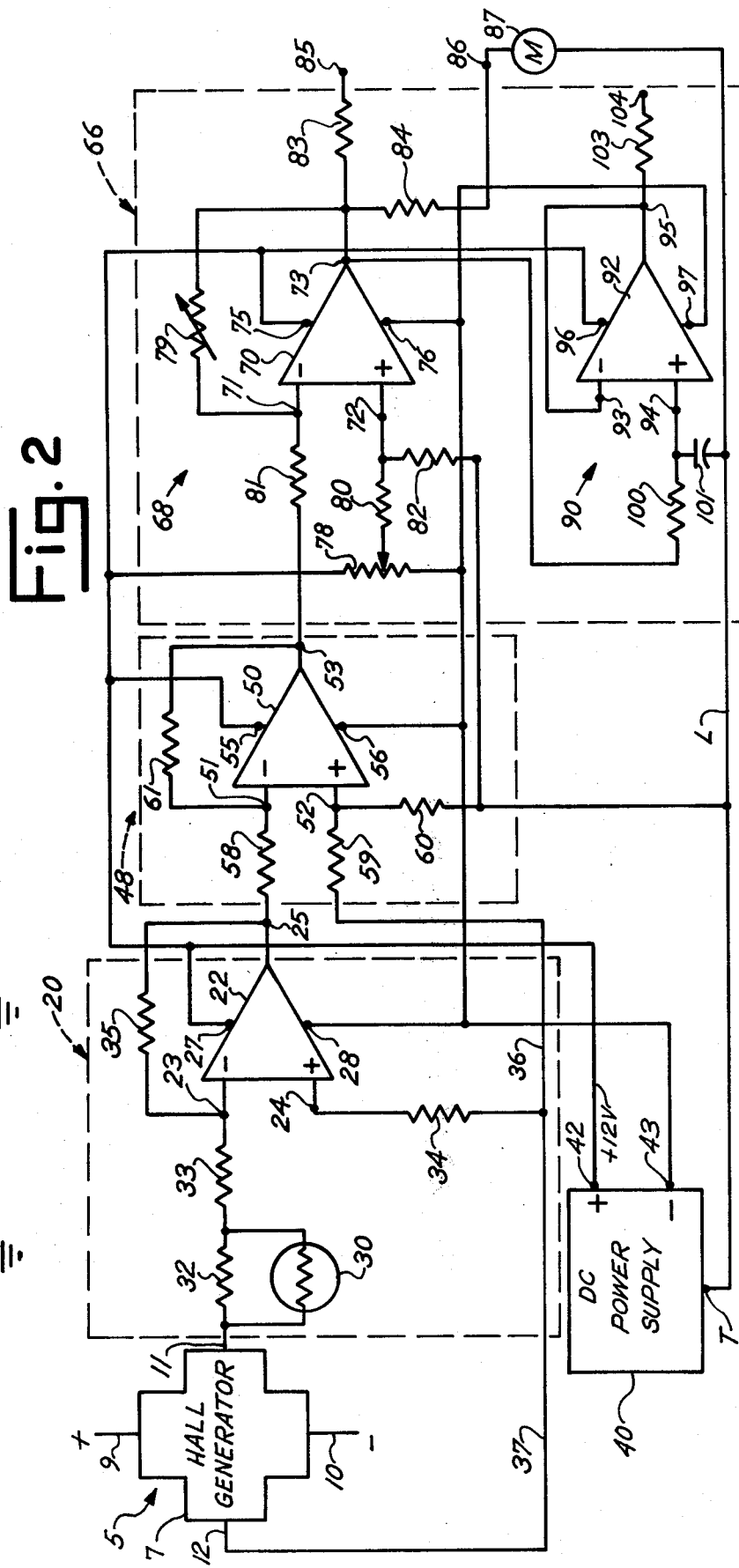

INSTRUMENT AMPLIFIER AND LOAD DRIVER HAVING OFFSET ELIMINATION AND COMMON MODE REJECTION

BACKGROUND AND SUMMARY OF THE INVENTION

This invention relates to electrical apparatus for accurately driving a load in proportion to a source voltage, and more particularly relates to apparatus for indicating the voltage generated by a signal generator, such as a Hall generator, a strain gauge bridge, or a Wheatstone bridge.

Referring to FIG. 1, the prior art typically has used a differential (difference) amplifier in order to drive a grounded load L from an ungrounded or floating signal generator G. The differential amplifier typically comprises an operational amplifier OP1 having an inverting input II and a non-inverting input NI. Operational amplifier OP1 is connected as a differential amplifier by means of input resistors R1–R3 and a feedback resistor R4. In order to amplify the difference in voltage produced by generator G and to reference that voltage to ground potential, the equation $R_4/R_1 = R_3/R_2$ must be satisfied as closely as possible, where R1–R4 equal the values of resistors R1–R4, respectively, in ohms. If a modern operational amplifier is employed, the common mode rejection characteristic of the stage, that is, the extent to which the amplifier output is independent of the common mode input voltage, is limited by the accuracy with which the foregoing equation is satisfied.

For some applications, such as the amplification of a Hall generator output voltage, or a thermocouple output voltage, a common mode rejection of at least 100 decibels, 100,000 to 1, is generally required. To achieve this degree of common mode rejection, the resistors would have to be matched to accuracies better than 0.001% over a wide range of temperatures and frequencies and for long periods of time. Such as approach would require an expensive resistor network, possibly located in a thermally-stabilized chamber.

It has been discovered that the deficiencies of the prior art can be overcome by combining non-differential and differential amplifier stages which are referenced to the signal generator and load in a novel manner. The signal generator generates a source voltage between first and second generator outputs. A non-differential gain stage generates an amplified voltage between the second generator output and the gain stage output which is proportional to the source voltage. The amplified voltage then is routed through a differential stage for generating a rereferenced voltage between the differential stage output and a first terminal of the load which is proportional to the amplified voltage from the non-differential stage and which is substantially independent of any offset voltage between the second generator output and the first terminal of the load. By coupling at least a portion of the rereferenced voltage to the load, the load can be driven in proportion to the source voltage even though the offset voltage may vary over a substantial range. By using this technique, common mode rejection of about 100,000 to 1 can be achieved by using conventional 1% resistors, and the need for a thermally-isolated environment is eliminated.

It also has been discovered that the source voltage can be measured and displayed on an indicator with improved precision by using this invention. According to this feature, the load comprises an amplifying stage which drives the indicator. Adjustable resistors can be employed in order to add gain adjustment and zeroing capability to the system. By using this arrangement, the meter can be driven in various ranges and can be zeroed to accommodate different DC offsets of the non-differential gain stage, differential stage or signal generator.

DESCRIPTION OF THE DRAWING

These and other objects and advantages of the present invention will hereafter appear in connection with the accompanying drawing wherein:

FIG. 1 is an electrical schematic drawing describing a prior art arrangement; and FIG. 2 is an electrical schematic drawing of a preferred form of the present invention.

DESCRIPTION OF THE PREFERRED EMBODIMENT

Referring to FIG. 2, a preferred form of the present invention basically comprises a signal generator 5, a non-differential gain stage 20, a DC power supply 40, a differential stage 48, and a load 66 which may include a gain adjusting stage 68, a meter 87 and an averaging circuit 90.

Signal generator 5 preferably comprises a conventional Hall generator 7 including bias current input leads 9, 10 and voltage output leads 11, 12. In order to operate Hall generator 7, a constant current source (not shown) is connected to leads 9, 10. The source maintains a relatively constant bias current flowing through the Hall generator. In response to the bias current, the Hall generator produces a source voltage between output leads 11 and 12. The source voltage between leads 11 and 12 is proportional to the strength of the magnetic field which is perpendicular to the surface of the Hall generator.

Non-differential gain stage 20 and differential stage 48 are used to amplify the source voltage and to drive a load independent of any voltage which may exist between lead 12 and load terminal L.

Stage 20 comprises an operational amplifier 22 having an inverting input 23, a non-inverting input 24 and an output terminal 25. Amplifier 22 is operated from a positive supply input 27 and a negative supply input 28. A thermistor 30 and resistors 32 and 33 couple lead 11 to inverting input 23. Additional resistors 34, 35 are connected as shown. Stage 20 generates an amplified voltage between output 25 and lead 12 which is linearly-proportional to the source voltage between leads 11 and 12. In other words, the output of stage 20 is referenced to lead 12 of signal generator 5.

DC operating voltage is supplied to the various circuitry stages by a DC power supply 40 having a positive supply terminal 42 and a negative supply terminal 43. Depending on the characteristics of amplifiers 22 and 50 and the type of operation desired, terminal L may be connected to positive supply terminal 42, negative supply terminal 43, or a voltage tap T having a value somewhere between the voltage between terminals 42 and 43.

Differential stage 48 comprises an operational amplifier 50 including an inverting input 51, and a non-inverting input 52. Supply voltage is conducted to operational amplifier 50 through a positive supply input 55 and a negative supply input 56. Resistors 58–61 are connected as shown. Stage 48 produces a rereferenced voltage between an output 53 and terminal L which is linearly-proportional to the amplified voltage between output 25 and lead 12. In addition, the rereferenced voltage is substantially independent of any offset voltage which may exist between generator output lead 12 and terminal L. In the general case, such an offset voltage will exist. Resistors 58, 59, 60 and 61 will have their values adjusted to satisfy the equation $R61/R58 = R60/R59$ where R58–R61 equal the values of resistors 58–61, respectively in ohms.

The gain adjusting stage 68 of load 66 comprises an operational amplifier 70, including an inverting input 71, a non-inverting input 72 and an output 73. DC operating voltage is supplied to amplifier 70 through a positive supply input 75 and a negative supply input 76. An adjustable potentiometer 78 and a fixed resistor 80 can be used for zeroing meter 87, and an adjustable potentiometer 79 can be used to adjust the gain of stage 68. Stage 68 also includes input resistors 81, 82 and output resistors 83, 84 which are connected to a voltage output terminal 85 and a current output terminal 86 in the manner shown.

Meter 87 comprises a conventional meter movement employing a wire coil.

Averaging circuit 90 comprises an operational amplifier 92 connected as a gain-of-one amplifier. The amplifier includes an inverting input 93, a non-inverting input 94 and an output 95. DC operating voltage is supplied to amplifier 92 through a positive supply input 96 and a negative supply input 97. The signal conducted to input 94 is passed through a filtering circuit comprising a resistor 100 and a capacitor 101. Amplifier 92 conducts its output signal through an output resistor 103 to a terminal 104.

The values of the components previously described are shown in Table A:

TABLE A

| Operational Amplifier | Manufacturer | Model No. |
|---|---|---|
| 22 | National Semiconductor | LM324N Quad operational Amplifier |
| 50 | | |
| 70 | | |
| 92 | | |

| Resistor | Value in Ohms |
|---|---|
| 30 | 1000 (at room temperature) |
| 32 | 1.2K |
| 33 | 4.99K |
| 34 | 4.7K |
| 35 | 1.33M |
| 58 | 4.99K |
| 59 | 4.99K |
| 60 | 4.99K |
| 61 | 4.99K |
| 78 | 0–2K |
| 79 | 10K–150K |
| 81 | 4.02K |
| 82 | 10K |
| 83 | 47 |
| 84 | 8.45K |
| 100 | 470K |
| 103 | 47 |

| Capacitor | Value in Microfarads |
|---|---|
| 101 | 0.22 |

Operational amplifiers 22, 50, 70, 92 may be fabricated as a single monolithic integrated circuit and each amplifier is capable of generating an output voltage substantially independent of changes in the supply voltages used to operate it.

Differential stage 48 is a difference amplifier in which the values of resistors 58–61 are adjusted according to the foregoing equation $R61/R58 = R60/R59$. By using the unique configuration of components shown in FIG. 2, the demands on resistor matching in the differential stage 48 are reduced by the gain of amplifier stage 20. That is, if amplifier stage 20 has a typical gain of 200, the matching requirements of resistors 58–61 are reduced by a factor of 200. For many applications, this results in the ability to use conventional 1% resistors and eliminates any need for maintaining these resistors in a thermally-controlled environment.

As a result of this unique circuitry, the rereferenced voltage potential between output 53 and terminal L does not substantially change when the voltages on Hall output leads 11, 12 change in value with respect to terminal L at the same time and to the same degree. In addition, as the source voltage between leads 11, 12 approaches zero, the rereferenced voltage between output 53 and terminal L also approaches zero subject only to the voltage offset imperfections in amplifiers 22 and 50.

A meter 87 may be used to indicate, in any units, the parameter measured and converted into a voltage by signal generator 5. For example, current is typically measured by implementing generator 5 as a Hall generator.

In order to measure the source voltage between leads 11, 12 of Hall generator 7 by means of meter 87, the following procedure is used. The Hall generator is biased with an appropriate constant current which flows between terminals 9 and 10. The Hall generator is then removed from the influence of any magnetic field and potentiometer 78 is adjusted until meter 87 reads zero volts.

The proper range for meter 87 in order to accommodate different ranges of voltage outputs from Hall generator 7 may be achieved by adjusting potentiometer 79. In place of the continuously-adjustable potentiometer shown, potentiometer 79 may comprise a series of fixed-value resistors connected in parallel through a series of switches which enable each parallel resistor to be individually connected into the circuit. The placement of potentiometer 79 in the feedback loop of amplifier 70 is an important feature. If the range-adjusting potentiometer were shifted to the location of resistor 35, then changing the range might cause the zero position of meter 87 to change. However, by placing potentiometer 79 in the position shown, meter 87 can be zeroed by using a single potentiometer, such as 78, and ranging can be accomplished without changing the zero setting.

Averaging circuit 90 filters the voltage produced on output 73 in order to produce a DC voltage on terminal 104 which corresponds to the average voltage generated across Hall output leads 11, 12. This feature provides a convenient means of providing both instantaneous and average voltage values on terminals 85 and 104, respectively.

Standard textbook analysis of the disclosed circuitry shows that stage 20 amplifies the source voltage between terminals 11, 12 without substantially altering the offset voltage between terminals 12 and L. If ideal operational amplifier performance is assumed, the voltage at terminal 25 equals the offset voltage (E off) minus R35/R33 times the source voltage (Es), where R35 is the value of resistor 35 and R33 is the value of resistor 33. As shown in Table A, R33 = 4.99 K and R35 = 1.33 M. Thus, R35/R33 = 266. Therefore, the voltage at terminal 25 equals the offset voltage minus 266 times the source voltage. In other words, stage 20 amplifies the source voltage without substantially changing the offset voltage.

Similar textbook analysis shows that stage 48 substantially eliminates the offset voltage on terminal 25. If ideal operational amplifier performance is assumed the voltage at terminal 53 (Eo) equals:

$$E \text{ off} \left[ \frac{R60\ R61 + R60\ R58 - R61\ R59 - R61\ R60}{R58\ (R59 + R60)} \right] - \frac{R61}{R58} AEs$$

where R58, R59, R60 and R61 equal the values of resistors 58, 59, 60 and 61, respectively, and AEs = amplified Es at 25.

Since R61/R58 = R60/R59, Eo = R61AEs/R58 = 4.99 KAEs/4.99 K = AEs.

In other words, stage 48 eliminates the offset voltage and makes the amplified source voltage available to drive meter 87. The amplified source voltage is made available on terminal 53 in the form of an output difference voltage.

Those skilled in the art will recognize that the single embodiment of the invention disclosed in FIG. 2 can be altered and modified without departing from the true spirit and scope of the invention as defined in the accompanying claims.

What is claimed is:

1. In a system including a load having a first load terminal and a second load terminal and also including a signal generator for generating a source voltage between first and second generator outputs, said generator also defining an offset voltage between the second generator output and the first load terminal, improved apparatus for increasing the accuracy with which the load can be driven in proportion to the source voltage comprising:

amplifying means for amplifying the source voltage without substantially changing the offset voltage to form at an amplifying output an amplified voltage comprising an amplified source voltage component proportional to the source voltage and an offset voltage component;

differential means for substantially eliminating the offset component from the amplified voltage to form a difference voltage proportional to the amplified source voltage component; and means for conducting at least a portion of the difference voltage to the second load terminal in order to create a load voltage proportional to the source voltage, whereby the independence of the load voltage from the offset voltage is increased.

2. Apparatus, as claimed in claim 1, wherein the differential means comprises:

a first operational amplifier operable from a DC supply voltage and including a first inverting input, a first non-inverting input and a differential output terminal;

first resistor means for coupling the amplifying output to the first inverting input;

second resistor means for coupling the second generator output to the first non-inverting input;

third resistor means for coupling the first load terminal to the first non-inverting input; and fourth resistor means for coupling the differential output to the first inverting input.

3. Apparatus, as claimed in claim 2, wherein the values of the resistor means are adjusted to satisfy the equation R4/R1 = R3/R2 where R1 equals the value of the first resistor means in ohms, R2 equals the value of the second resistor means in ohms, R3 equals the value of the third resistor means in ohms and R4 equals the value of the fourth resistor means in ohms.

4. Apparatus, as claimed in claim 1, wherein the amplifying means comprises:

a second operational amplifier operable from a DC supply voltage and including a second inverting input, a second non-inverting input and a second output terminal connected as said amplifying output;

fifth resistor means for coupling the first generator output to the second inverting input;

means for coupling at least a portion of the second generator output to the second non-inverting input; and sixth resistor means for coupling the second output terminal to the second inverting input.

5. Apparatus, as claimed in claim 2, wherein the amplifying means comprises:

a second operational amplifier operable from a DC supply voltage and including a second inverting input, a second non-inverting input and a second output terminal connected as said amplifying output;

fifth resistor means for coupling the first generator output to the second inverting input;

means for coupling at least a portion of the second generator output to the second non-inverting input; and sixth resistor means for coupling the second output terminal to the second inverting input.

6. Apparatus, as claimed in claim 4, and further comprising:

voltage supply means for generating said DC supply voltage between a first supply terminal and a second supply terminal;

means for connecting the voltage supply means to the first load terminal; and means for conducting the DC supply voltage to the amplifying means and the differential means.

7. Apparatus, as claimed in claim 6, wherein the amplifying means comprises means for maintaining the voltages on the second inverting input and the second non-inverting input substantially independent of changes in the DC supply voltage.

8. Apparatus, as claimed in claim 6, wherein the amplifying means comprises means for maintaining the amplified voltage substantially independent of changes in the DC supply voltage.

9. Apparatus, as claimed in claim 1, wherein the amplifying means and differential means each comprise a monolithic integrated circuit.

10. Apparatus, as claimed in claim 1, wherein the load comprises a meter.

11. Apparatus, as claimed in claim 1, wherein the signal generator comprises a Hall-effect generator.

12. Apparatus for displaying the magnitude of a source voltage generated between first and second generator outputs of a signal generator, said apparatus comprising:

indicator means including first and second indicator terminals for displaying a reading responsive to the source voltage, said signal generator defining an offset voltage between the second generator output and the second indicator terminal;

first amplifying means for amplifying the source voltage without substantially changing the offset voltage to form at a first amplifying output an amplified voltage comprising an amplified source voltage component proportional to the source voltage and an offset voltage component;

differential means for substantially eliminating the offset component from the amplified voltage to form a difference voltage at a differential output proportional to the amplified source voltage component;

second amplifying means, including a first amplifying input, a second amplifying input, and a second amplifying output for driving the indicator means;

first means for coupling the second indicator terminal to the second amplifying input;

second means for coupling the first indicator terminal to the second amplifying output;

third means for coupling the differential output to the first amplifying input; and adjustable feedback means for coupling the second amplifying output to the first amplifying input, whereby the gain of the second amplifying means can be altered so that the range of the indicator means is adjusted.

13. Apparatus, as claimed in claim 12, and further comprising means for adjusting the voltage applied to the second amplifying input, whereby the indicator can be adjusted to indicate zero volts when the source voltage is zero.

14. Apparatus, as claimed in claim 12, wherein the differential means comprises:
 a first operational amplifier operable from a DC supply voltage and including a first inverting input, a first non-inverting input and a first output terminal connected as said differential output;
 first resistor means for coupling the first amplifying output to the first inverting input;
 second resistor means for coupling the second generator output to the first non-inverting input;
 third resistor means for coupling the second indicator terminal to the first non-inverting input; and
 fourth resistor means for coupling the differential output to the first inverting input.

15. Apparatus, as claimed in claim 14, wherein the values of the resistor means are adjusted to satisfy the equation R4/R1 = R3/R2 where R1 equals the value of the first resistor means in ohms, R2 equals the value of the second resistor means in ohms, R3 equals the value of the third resistor means in ohms and R4 equals the value of the fourth resistor means in ohms.

16. Apparatus, as claimed in claim 12, wherein the first amplifying means comprises:
 a second operational amplifier operable from a DC supply voltage and including a second inverting input, a second non-inverting input and a second output terminal connected as said first amplifying output;
 fifth resistor means for coupling the first generator output to the second inverting input;
 sixth resistor means for coupling the second generator output to the second non-inverting input; and
 seventh resistor means for coupling the second output terminal to the second inverting input.

17. Apparatus, as claimed in claim 12, and further comprising:
 voltage supply means for generating said DC supply voltage between a first supply terminal and a second supply terminal;
 means for connecting the voltage supply terminal to the second indicator terminal; and
 means for conducting the DC supply voltage to the first amplifying means and the differential means.

18. Apparatus, as claimed in claim 12, wherein the second amplifying means comprises a third operational amplifier, wherein the first amplifying input comprises an inverting input of the third operational amplifier, wherein the second amplifying input comprises a non-inverting input of the third operational amplifier, and wherein the second amplifying output comprises an output of the third operational amplifier.

19. Apparatus, as claimed in claim 12, wherein the signal generator comprises a Hall generator.

20. Apparatus, as claimed in claim 17, wherein the indicator means comprises a meter.

21. Apparatus, as claimed in claim 12, wherein the indicator means comprises a meter.

22. In a system comprising a signal generator capable of generating a transducer voltage comprising a source voltage component generated between first and second generator terminals and an offset voltage component generated between the second generator terminal and a load terminal, an improved method of driving a load connected to the load terminal with a load voltage proportional to the source voltage component comprising the steps of:
 amplifying the source voltage without substantially changing the offset voltage to form an amplified voltage comprising an amplified source voltage component and the offset component;
 substantially eliminating the offset component from the amplified voltage to form a difference voltage proportional to the source voltage; and
 driving the load with the difference voltage.

23. A method, as claimed in claim 22, wherein the step of eliminating the offset component comprises the step of making the difference voltage substantially equal to the amplified source voltage component.

* * * * *

Disclaimer 4,138,641.—*Richard A. Karlin* and *Kir K. O. K. Rim*, Chicago, Ill. INSTRUMENT AMPLIFIER AND LOAD DRIVER HAVING OFFSET ELIMINATION AND COMMON MODE REJECTION. Patent dated Feb. 6, 1979. Disclaimer filed July 6, 1984, by the assignee, *Sun Electric Corp.*

Hereby enters this disclaimer to claims 22 and 23 of said patent.
[*Official Gazette Sept. 25, 1984.*]